(12) United States Patent
Sarangapani et al.

(10) Patent No.: US 9,589,694 B2
(45) Date of Patent: Mar. 7, 2017

(54) ALLOYED 2N COPPER WIRES FOR BONDING IN MICROELECTRONICS DEVICES

(71) Applicant: Heraeus Materials Technology GmbH & Co. KG, Hanau (DE)

(72) Inventors: Murali Sarangapani, Singapore (SG); Ping Ha Yeung, Singapore (SG); Eugen Milke, Frankfurt (DE)

(73) Assignee: Heraeus Deutschland GmbH & Co. KG, Hanau (DE)

( * ) Notice: Subject to any disclaimer, the term of this patent is extended or adjusted under 35 U.S.C. 154(b) by 365 days.

(21) Appl. No.: 13/690,701

(22) Filed: Nov. 30, 2012

(65) Prior Publication Data

US 2013/0140084 A1 Jun. 6, 2013

(30) Foreign Application Priority Data

Dec. 1, 2011 (SG) .................................. 201108910

(51) Int. Cl.
 *C22C 9/00* (2006.01)
 *H01B 1/02* (2006.01)
 (Continued)

(52) U.S. Cl.
 CPC ............. *H01B 1/026* (2013.01); *B23K 20/10* (2013.01); *B23K 35/302* (2013.01); *C22C 1/02* (2013.01); *C22C 9/00* (2013.01); *C22C 9/06* (2013.01); *C22F 1/00* (2013.01); *C22F 1/08* (2013.01); *H01L 24/43* (2013.01); *H01L 24/45* (2013.01); *H01R 4/029* (2013.01); *B23K 2201/42* (2013.01); *H01L 24/48* (2013.01); *H01L 24/49* (2013.01); *H01L 2224/43* (2013.01); *H01L 2224/43848* (2013.01); *H01L 2224/45015* (2013.01); *H01L 2224/45124* (2013.01); *H01L 2224/45139* (2013.01);
 (Continued)

(58) Field of Classification Search
 CPC ....................................................... H01B 1/026
 USPC ....................................................... 174/94 R
 See application file for complete search history.

(56) References Cited

U.S. PATENT DOCUMENTS 2,033,709 A * 3/1936 Hensel ..................... C22C 9/00
 148/411
3,881,965 A 5/1975 Matsuda et al.
 (Continued)

FOREIGN PATENT DOCUMENTS

CN 1949492 A 4/2007
CN 1949493 A 4/2007
 (Continued)

OTHER PUBLICATIONS

Search Report and Written Opinion issued Sep. 14, 2012 in SG Application No. 201108910-9.
 (Continued)

*Primary Examiner* — Jenny L Wagner
*Assistant Examiner* — Michael E Moats, Jr.
(74) *Attorney, Agent, or Firm* — Panitch Schwarze Belisario & Nadel LLP

(57) ABSTRACT

An alloyed 2N copper wire for bonding in microelectronics contains 2N copper and one or more corrosion resistance alloying materials selected from Ag, Ni, Pd, Au, Pt, and Cr. A total concentration of the corrosion resistance alloying materials is between about 0.009 wt % and about 0.99 wt %.

8 Claims, 7 Drawing Sheets

Ball bond of alloyed 2N Cu 0.8mil wire

(51) Int. Cl.
*C22C 9/06* (2006.01)
*H01R 4/02* (2006.01)
*B23K 35/30* (2006.01)
*C22C 1/02* (2006.01)
*C22F 1/08* (2006.01)
*H01L 23/00* (2006.01)
*C22F 1/00* (2006.01)
*B23K 20/10* (2006.01)

(52) U.S. Cl.
CPC ............... *H01L 2224/45144* (2013.01); *H01L 2224/45147* (2013.01); *H01L 2224/4847* (2013.01); *H01L 2224/48465* (2013.01); *H01L 2224/48511* (2013.01); *H01L 2224/49171* (2013.01); *H01L 2224/73265* (2013.01); *H01L 2924/01006* (2013.01); *H01L 2924/01015* (2013.01); *H01L 2924/01047* (2013.01)

(56) References Cited

U.S. PATENT DOCUMENTS 5,118,470 A * 6/1992 Tanigawa .................. C22C 9/00
257/E23.025
6,518,505 B1 2/2003 Matsui et al.

FOREIGN PATENT DOCUMENTS

| EP | 1482063 | A1 | | 12/2004 | | |
|----|---------|----|---|---------|---|---|
| EP | 1911856 | A1 | | 4/2008 | | |
| JP | S61-113740 | A | | 5/1986 | | |
| JP | 04184946 | | * | 11/1990 | ........... | H01L 21/285 |
| JP | H04-184946 | A | | 7/1992 | | |
| JP | H0770674 | A | | 3/1995 | | |
| JP | H0786325 | A | | 3/1995 | | |
| JP | H1166947 | | * | 8/1997 | ............... | H01B 1/02 |
| JP | 11-066947 | A | | 3/1999 | | |
| JP | 02002299284 | A | * | 4/2001 | ........... | H01L 21/285 |
| JP | 02004193552 | A1 | * | 7/2003 | ........... | H01L 21/285 |

OTHER PUBLICATIONS

Office Action dated Feb. 27, 2015 in CN Application No. 201210511419.4.

Office Action issued Mar. 21, 2016 in CN Application No. 201210511419.4.

* cited by examiner

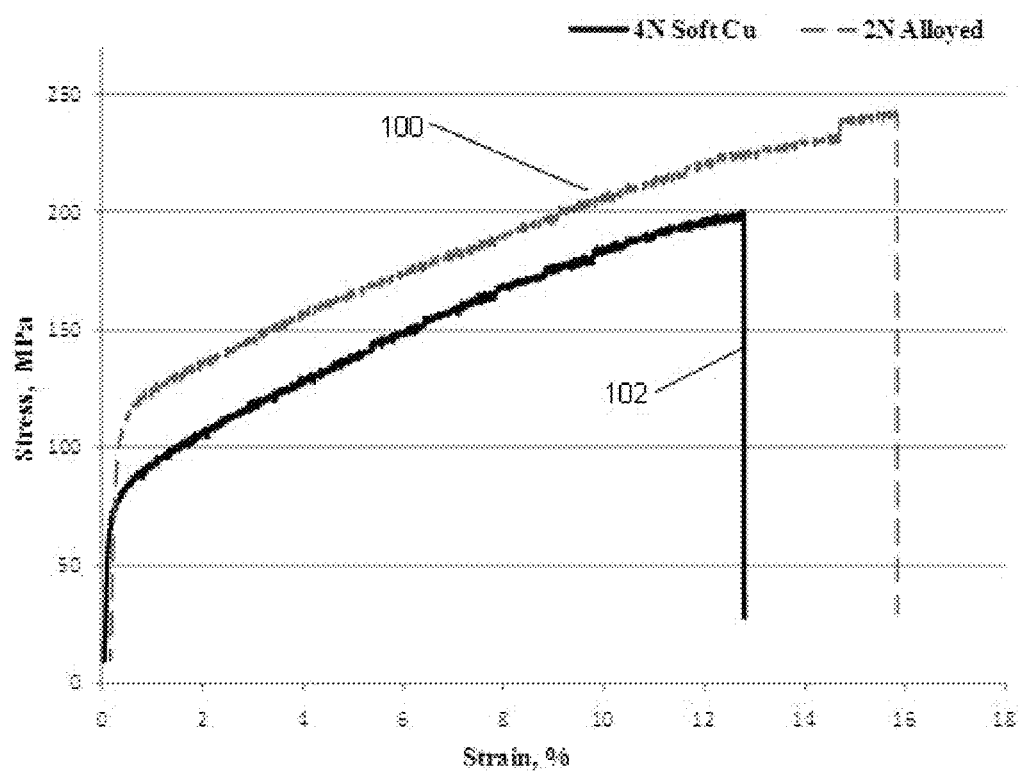
Fig 1 - Tensile stress-strain curve of Cu 0.8mil wires; 4N soft Cu and 2N alloyed

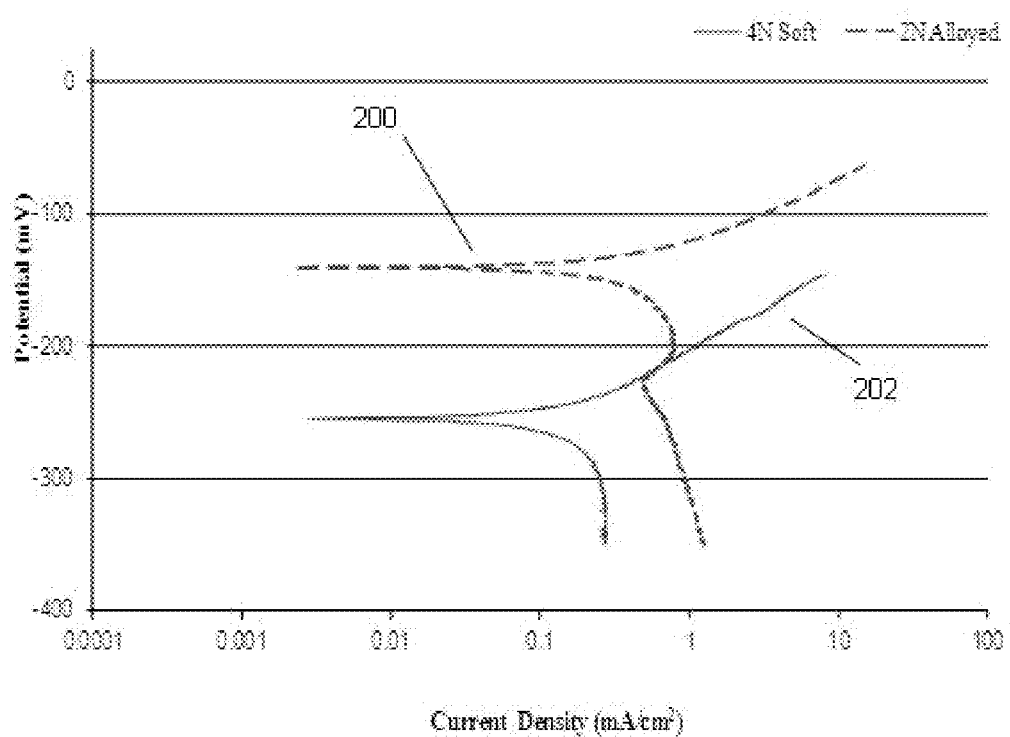
Fig 2 – Polarization scan of Cu wires; 4N soft Cu and 2N alloyed

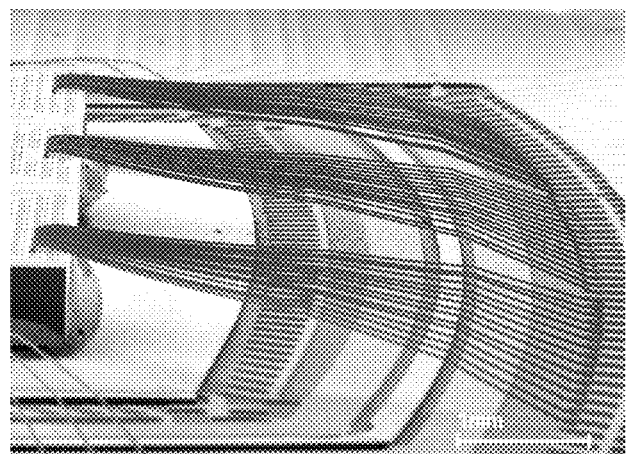
Fig 3(a) – Loop bonds of alloyed 2N Cu 0.8mil wire
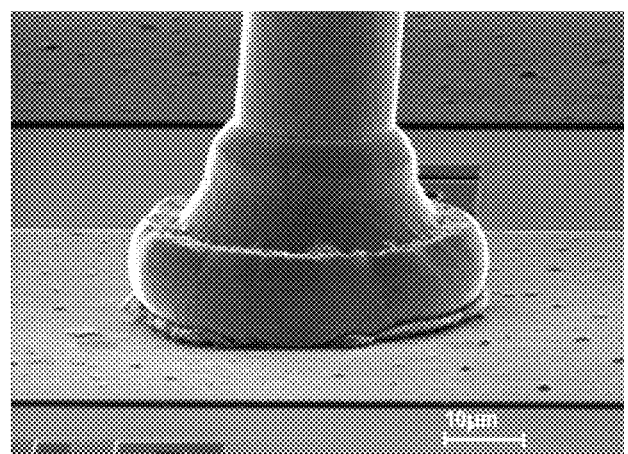
Fig 3(b) – Ball bond of alloyed 2N Cu 0.8mil wire
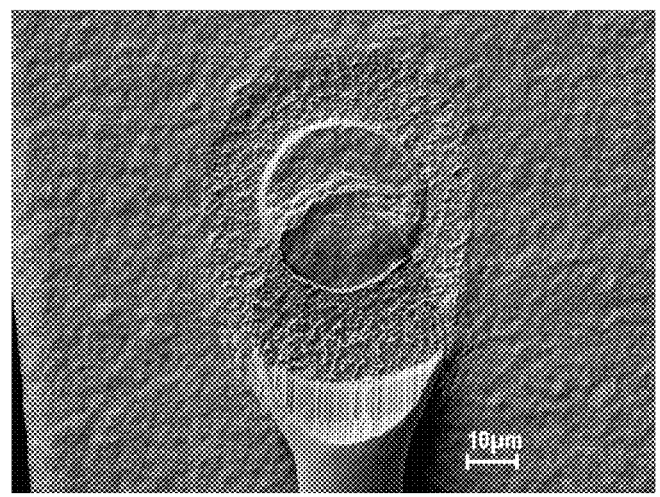
Fig 3(c) – Stitch bond of alloyed 2N Cu 0.8mil wire

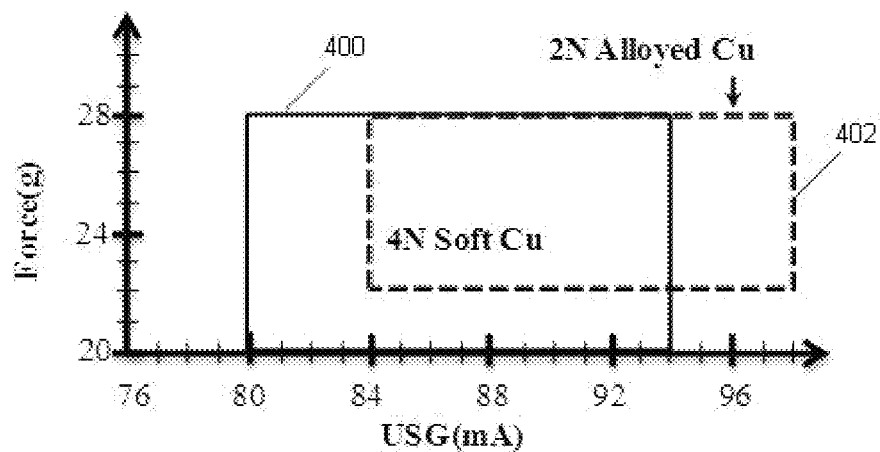
Fig 4(a) - Ball Bond Process Window
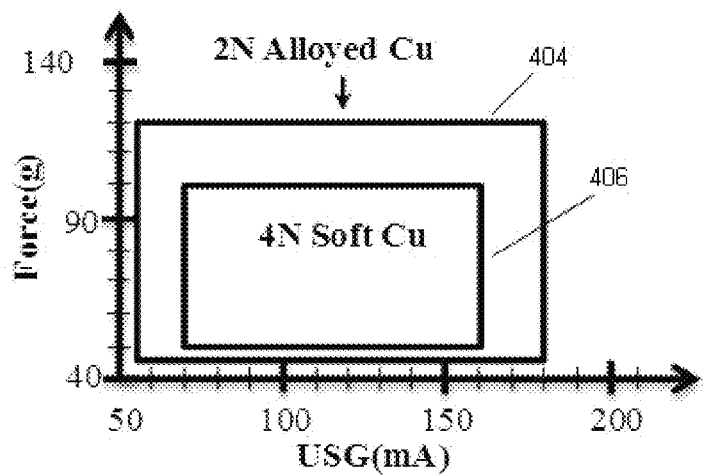
Fig 4(b) - Stitch Bond Process Window

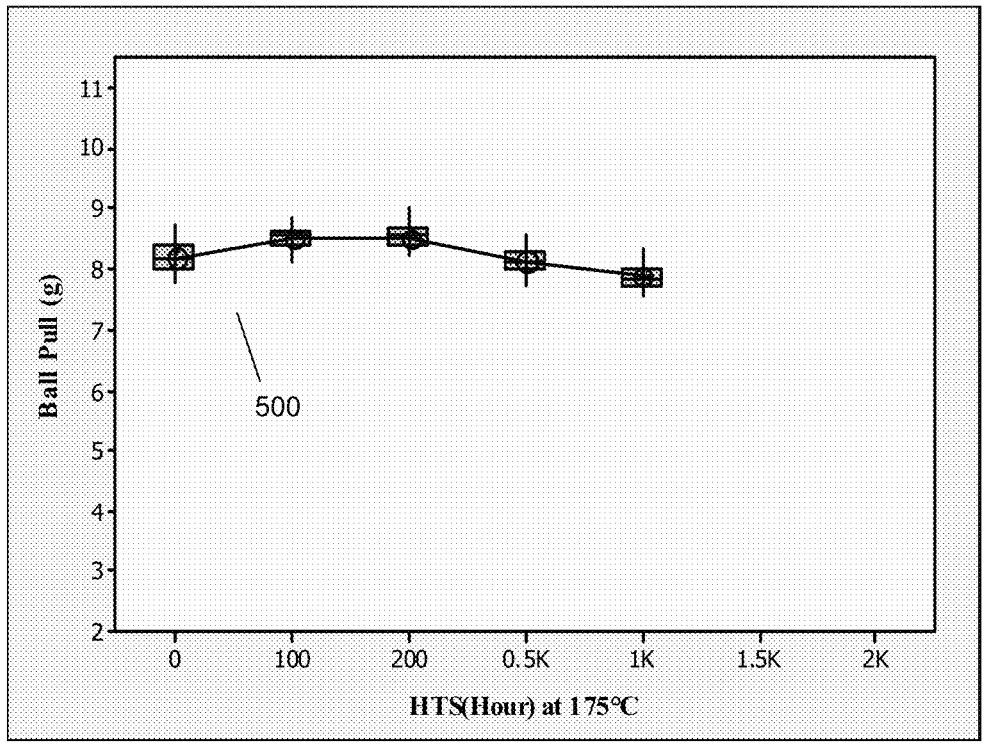
Fig 5(a) - Thermal aged 4N soft Cu 0.8mil wires
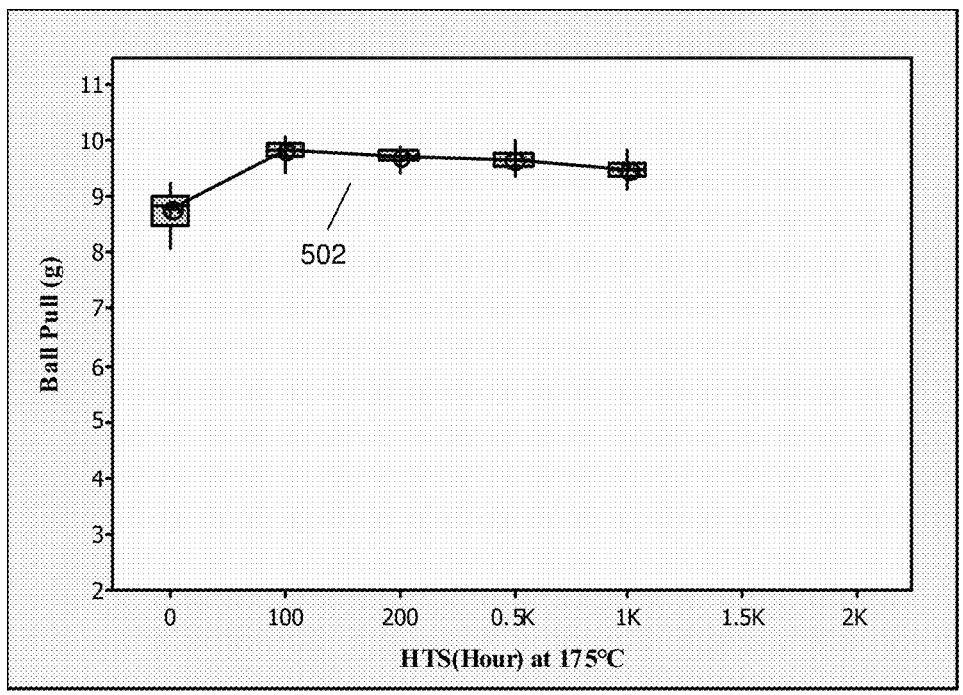
Fig 5(b) - Thermal aged 2N alloyed Cu 0.8mil wires Fig. 6(a) - Ultra low loop comparison of Cu 0.8mil wires; 4N soft and 2N alloyed

ALLOYED 2N COPPER WIRES FOR BONDING IN MICROELECTRONICS DEVICES

BACKGROUND OF THE INVENTION

The present invention relates broadly to alloyed 2N copper wires for bonding in microelectronics.

Fine Au, Cu, and Al wires are widely used for interconnections in integrated chips. Silver wires have also been examined for unique applications. For Au and Al wires, usually 2N to 4N purities (99 to 99.99 %) are utilized, while only 4N purity is typically used for Cu. 5N to 8N purity Cu wires have been examined, but are not in practice. Dopants are often added to wires for specific properties, such as loop capabilities, reliability, bondability, corrosion resistance, etc. Wires in the range of 18 µm to 75 µm diameter are commonly used in wire bonding. For high current carrying applications, wires in the diameter range of 200 µm to 400 µm are typically employed.

Alloys for wires are typically continuously cast into rods of 2 mm to 25 mm diameter and are further drawn in heavy, intermediate, and fine steps. The fine drawn wires are annealed at high temperatures around 0.25 to 0.6 Tm (melting point of the wire) and later spooled, vacuum packed and stored for bonding.

Several patents report the benefits of doped and alloyed Cu wires. For example, the addition of 0.13 to 1.17 mass % Pd is reported to provide wires with high reliability in the pressure cooker test (PCT). Cu wires doped with <700 ppm Mg and P, maintaining 30 ppm of oxygen (O), and with the addition of elements Be, Al, Si, In, Ge, Ti, and V (6-300 ppm) and Ca, Y, La, Ce, Pr, and Nd (<300 ppm) were found to be good for bonding. The addition of Nb and P in the range of 20-100 ppm, along with the elements Cs, Lu, Ta, Re, Os, Ir, Po, At, Pr, Pm, Sm, and Gd (<50 ppm) and Zr, Sn, Be, Nd, Sc, Ga, Fr, and Ra (<100 ppm) were reported to yield soft and bondable wires. A bondable Cu wire was produced when doped with a maximum of 1000 ppm of the elements Mn, Co, Ni, Nb, Pd, Zr and In. If the wire contained Be, Fe, Zn, Zr, Ag, Sn, V <2000 ppm, it was found to be bondable and reliable. Other prior art reports that the addition of boron (B) up to 100 ppm with a small amount of Be, Ca, and Ge (<10 ppm), while maintaining sulfur (S) at <0.5 ppm, yielded a wire that exhibited low ball hardness and reduced work hardening. Cu wire containing Cr<25 ppm, Zr<9 ppm, Ag<9 ppm, and Sn<9 ppm demonstrated bondability as good as Au wire. The low level additions of Fe, Ag, Sn, and Zr<9 ppm were reported to produce a normal bondable wire. Further, the addition of the elements B, Na, Mg, Al, Si, Ca, K, V, Ga, Ge, Rb, Sr, Y, Mo, Cd, Cs, Ba, Hf, Ta, Tl, and W<1000 ppm provided superior properties suitable for bonding.

Other prior art reports that Cu wire processed using ultra high purity Cu, such as 8N (99.999999%), and containing O, C, H, N, S, and P<1 ppm produced soft wire with 40 HV hardness. Further, Cu wires processed using purity 5N and 6N and doped with any one of the elements or combined with different combinations of Ti, Cr, Fe, Mn, Ni, and Co and maintaining <4.5 ppm showed good bondability. The combination of Hf, V, Ta, Pd, Pt, Au, Cd, B, Al, In, Si, Ge, Pb, S, Sb, and Bi at <4.5 ppm with Nb<4.5 ppm using 5N and 6N purity Cu also showed good bondability. The addition of Ti at 0.12-8.4 ppm along with Mg, Ca, La, Hf, V, Ta, Pd, Pt, Au, Cd, B, Al, In, Si, Ge, Pb, P, Sb, Bi, and Nb at <0.16-8.1 ppm is taught to yield wires suitable for bonding.

A Cu wire with an impurity of <4 ppm and containing Mg, Ca, Be, In, Ge, Tl<1 ppm performed equal to Au wire and was soft as 35 HV.

In other prior art, a clean spherical free air ball was achieved using 4N Cu wire containing Mg, Al, Si, and P<40 ppm. Similarly, a Cu wire of 40 to 50 HV was attained, maintaining a purity <10 ppm with the addition of La, Ce, Pr, Nd, Sm, Eu, Gd, Tb, Dy, Ho, Er, Tm, Yb, Lu, Sc, and Y<20 ppm or Mg, Ca, Be, Ge, and Si<20 ppm. Cu wire with the addition of Ni and Co<100 ppm and Ti, Cr, Mn, Fe, Ni, Zr, Nb, Pd, Ag, In, and Sn<150 ppm showed corrosion resistance and hardness of 41 HV. Also, Cu wire containing Ti, Fe, Cr, Mn, Ni, and Co<150 ppm performed quite well on bonding. A soft Cu wire with <49 HV was attained using zone refined Cu and maintaining Mg, Ca, Ti, Zr, and Hf<100 ppm. The addition of elements Be, Sn, Zn, Zr, Ag, Cr, and Fe to a maximum 2 wt %, with maintained H, N, O, C contents and controlled gas creation ($H_2$, CO, $N_2$, $O_2$) during free air ball, provided a superior bond strength. Further, adding 400 ppm of Mg and traces of Fe and Ag provided reduction in crack formation near the heat affected zone (HAZ). The wire was corrosion resistant and it was processed using 6N purity Cu. The addition of La<0.002 wt %, Ce<0.003 wt %, and Ca<0.004 wt % to a 4N Cu wire provided a long storage life.

Generally, there is a demand for alloyed Cu wires with good bondability, free air ball formation in an inert or reactive environment, reliability, in particular under highly accelerated stress test (HAST), good looping performance, and easy drawability in mass production scale properties. Slight increases in resistivity of 5-15% are typically the disadvantage of alloyed Cu wires. However, if the wire exhibits superior reliability performance, especially under HAST, the wire is attractive even with increased resistivity and cost.

BRIEF SUMMARY OF THE INVENTION

Example embodiments of the present invention seek to provide alloyed 2N Cu wires for bonding in microelectronics that can provide high reliability performance with reduced compromises in other properties.

According to a first aspect of the present invention, there is provided an alloyed 2N copper wire for bonding in microelectronics comprising 2N copper and one or more corrosion resistance alloying materials selected from the group consisting of Ag, Ni, Pd, Au, Pt, and Cr, wherein a total concentration of the corrosion resistance alloying materials is between about 0.009 wt % and about 0.99 wt %.

The corrosion resistance alloying material may comprise about 0.009 wt % to about 0.99 wt % Ag.

The corrosion resistance alloying material may comprise about 0.009 wt % to about 0.99 wt % Ni.

The corrosion resistance alloying material may comprise about 0.009 wt % to about 0.129 wt % Pd.

The corrosion resistance alloying material may comprise about 0.009 wt % to about 0.99 wt % Au.

The corrosion resistance alloying material may comprise about 0.009 wt % to about 0.99 wt % Pt.

The corrosion resistance alloying material may comprise about 0.009 wt % to about 0.99 wt % Cr.

The corrosion resistance alloying material may comprise about 0.005 wt % to about 0.07 wt % Ag and about 0.009 wt % to about 0.89 wt % Ni.

The corrosion resistance alloying material may comprise about 0.005 wt % to about 0.07 wt % Ag and about 0.009 wt % to about 0.89 wt % Pd.

The corrosion resistance alloying material may comprise about 0.005 wt % to about 0.07 wt % Ag and about 0.009 wt % to about 0.89 wt % Au.

The corrosion resistance alloying material may comprises about 0.005 wt % to about 0.07 wt % Ag and about 0.009 wt % to about 0.89 wt % Pt.

The corrosion resistance alloying material may comprise about 0.005 wt % to about 0.07 wt % Ag and about 0.009 wt % to about 0.89 wt % Cr.

The corrosion resistance alloying material may further comprises about 0.008 wt % P.

The corrosion resistance alloying material may further comprise about 0.005 wt % to 0.013 wt % of a deoxidizer alloying material. The deoxidizer alloying material may comprise about 0.005 wt % Ca, Ce, Mg, La and Al. The deoxidizer alloying material may further comprise about 0.008 wt % P.

The corrosion resistance alloying material may further comprise about 0.012 wt % to 0.027 wt % of a grain refiner alloying material. The grain refiner alloying material may comprise about 0.005 wt % to about 0.02 wt % of Fe, about 0.005 wt % of B, and about 0.002 wt % of Zr and Ti.

The alloyed 2N copper wire may further comprise about 0.0003 wt % S.

According to a second aspect of the present invention, there is provided an alloyed 2N copper wire for bonding in microelectronics consisting of 2N copper and one or more corrosion resistance alloying materials selected from the group consisting of Ag, Ni, Pd, Au, Pt, and Cr, wherein a total concentration of the corrosion resistance alloying materials is between about 0.009 wt % and about 0.99 wt %. More particularly, the corrosion resistance alloying materials may be present in amounts such as the specific embodiments described in the preceding paragraphs.

According to a third aspect of the present invention, there is a provided a system for bonding an electronic device, comprising a first bonding pad, a second bonding pad, and an alloyed 2N copper wire according to the invention, wherein the wire is connected to the first and second bonding pads by wedge-bonding.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings:

FIG. 1 shows comparative tensile stress-strain data for 2N alloyed Cu wires according to an example embodiment;

FIG. 2 shows comparative polarization scan data for 2N alloyed Cu wires according to an example embodiment;

FIGS. 3(a)-(c) are SEM images illustrating loop, ball, and stitch bonds for 2N alloyed Cu wires according to an example embodiment;

FIGS. 4(a)-(b) show comparative ball bond and stitch bond process window data for 2N alloyed Cu wires according to an example embodiment;

FIGS. 5(a)-(b) show comparative thermal aging (high temperature storage) data for 2N alloyed Cu wires according to an example embodiment; and FIGS. 6(a)-(c) show comparative loop height data and SEM images of low loop bands for 2N alloyed Cu wires according to an example embodiment.

DETAILED DESCRIPTION OF THE INVENTION

Figure 6B:
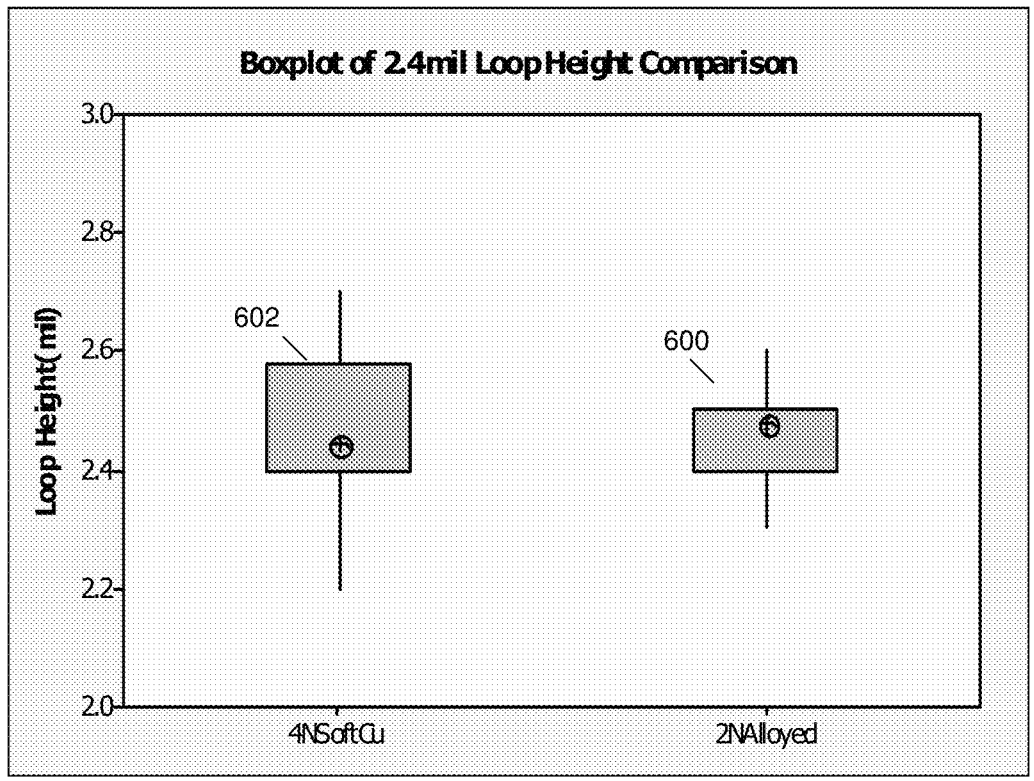
Figure 6C:
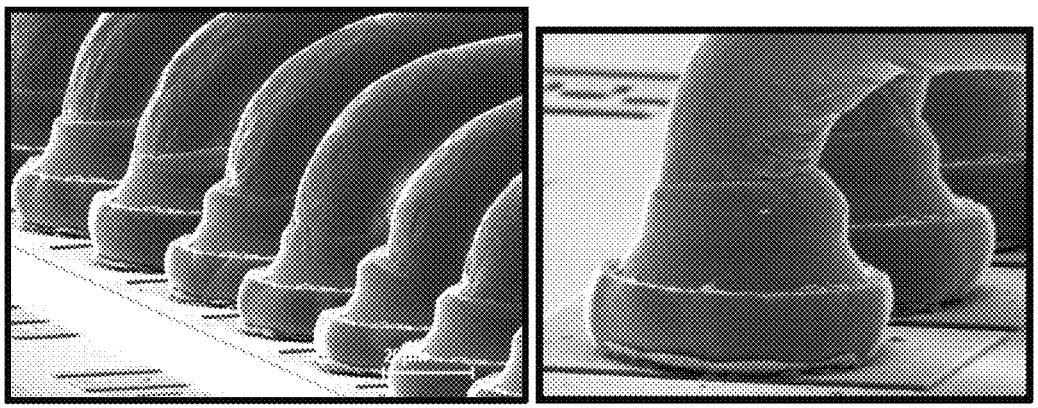

The example embodiments described herein provide alloyed 2N Cu wires for bonding in microelectronics packaging industries. The wires are prepared using high purity Cu (>99.99%) and as major alloying elements Ag, Ni, Pd, Au, Pt, Cr, Ca, Ce, Mg, La, Al, P, Fe, B, Zr and Ti. Fine wires are drawn from the alloyed Cu. The wires in example embodiments are bondable to Al bond pads, as well as Ag, Cu, Au, Pd plated surfaces. The results of HTS (high temperature storage) of the wire bonds are comparable to a commercially available 4N soft Cu reference wire, when bonded to an Al bond pad and stored at about 175° C. for about 1000 hours. Corrosion resistance of the alloyed wires is advantageously better than the 4N soft Cu reference wire. As will be appreciated by a person skilled in the art, HAST or THB (temperature humidity bias) tests are typically conducted for Cu wire bonded and epoxy molded devices using biased or unbiased conditions. During the test, the Cu wire bond interface (i.e., Cu wire welded to Al bond pad) undergoes electro-chemical based galvanic corrosion. Moisture absorption by the epoxy is the source for diffusion of hydroxyl ions ($OH^-$). Parts per million levels of halogen (Cl, Br, etc.) contamination in the epoxy are the source for $Cl^-$ ions. Polarization scans recorded for wires according to example embodiments of the present invention under an electrochemical reaction of the wire in dilute HCl revealed a positive rest potential exhibiting corrosion resistance. Hence, 2N alloyed Cu wires according to example embodiments are expected to perform better on reliability studies such as HAST and THB.

The 2N alloyed Cu is continuously cast into rods. Elements are added individually or combined to a maximum of about 0.99 wt. %, maintaining the purity of the wire to be 2N in the example embodiments. The cast rods are wire drawn to a fine diameter of about 10 μm to 250 μm. The fine wires in example embodiments advantageously exhibit good free air ball (FAB) formation, bondability, loop formation, and reliability (HTS). Hardness, tensile strength, surface oxidation, electrical resistivity, and fusing current of the wires with trace additions in example embodiments are slightly higher than for the 4N soft Cu reference wire for bonding in microelectronics packaging sectors, while advantageously revealing better corrosion resistance without drastically compromising softness.

In the example embodiments, copper of 4N to 5N purity was used to prepare the alloys and was melted in a vacuum induction furnace. At least one of Ag, Ni, Pd, Au, Pt, Cr, Ca, Ce, Mg, La, Al, P, Fe, B, Zr and Ti was added into the melt and held for about 2 to 15 minutes to allow a thorough dissolution. The elements were added individually or combined. The alloy was continuously cast into about 2 mm to 25 mm rods at a slow speed. No significant loss in dopant additions was observed. These rods were cold wire drawn at room temperature (about 23-25° C.).

A tungsten carbide die was used to initially draw heavy wire, and a diamond die was used for further reduction to fine wire. The wire was drawn in three stages at a drawing speed of about 15 m/s or less. The die reduction ratios were about 14-18% for heavy wires and about 4 to 12% for fine wires. During cold drawing, the wires were lubricated and intermediate annealed between stages to reduce the residual stresses. Finally, the drawn wires were strand annealed, spooled on clean anodized (plated) aluminum spools, vacuum packed and stored.

Hardness was measured using a Fischer scope H100C tester with a Vickers indenter applying 15 mN force for 10 s dwell time. Tensile properties of the wires were tested using Instron-5300. The wires were bonded using a Kulicke & Soffa (K&S)-iConn bonder. The bonded wires were observed in a LEO-1450VP scanning electron microscope.

The alloyed elements and ranges of additions in the example embodiments are shown in Table 1 Noble metals Ag, Au, Pd, and Pt, and metals Ni and Cr were alloyed to improve the corrosion resistance of the Cu wire. In some embodiments, Ca, Ce, Mg, La, Al, P were alloyed as deoxidizers, softening the FAB. In some embodiments, Fe, B, Zr, Ti were alloyed as grain refiners to influence FAB grains. Boron was added in some embodiments to influence the strain hardening of the wire along with Ag and Ni.

TABLE 1

| Composition (wt %) of 2N alloyed Cu wire | | | | | | | | | |
|---|---|---|---|---|---|---|---|---|---|
| Alloy/Element | Ag | Ni | Pd | Au | Pt | Cr | Ca + Ce | Mg + La | Al |
| 4N soft Cu | <0.012 | | | each <0.0002 | | | | | |
| 1 | 0.009-0.99 | — | — | — | — | — | — | — | — |
| 2 | — | 0.009-0.99 | — | — | — | — | — | — | — |
| 3 | — | — | 0.009-0.129 | — | — | — | — | — | — |
| 4 | — | — | — | 0.009-0.99 | — | — | — | — | — |
| 5 | — | — | — | — | 0.009-0.99 | — | — | — | — |
| 6 | — | — | — | — | — | 0.009-0.99 | — | — | — |
| 7 | 0.005-0.07 | 0.009-0.89 | — | — | — | — | — | — | — |
| 8 | 0.005-0.07 | — | 0.009-0.89 | — | — | — | — | — | — |
| 9 | 0.005-0.07 | — | — | 0.009-0.89 | — | — | — | — | — |
| 10 | 0.005-0.07 | — | — | — | 0.009-0.89 | — | — | — | — |
| 11 | 0.005-0.07 | — | — | — | — | 0.009-0.89 | — | — | — |
| 12 | 0.005-0.07 | 0.009-0.89 | — | — | — | — | — | — | — |
| 13 | 0.005-0.07 | — | 0.009-0.89 | — | — | — | — | — | — |
| 14 | 0.005-0.07 | 0.009-0.89 | — | — | — | — | — | 0.005 | — |
| 15 | 0.005-0.07 | — | 0.009-0.89 | — | — | — | — | 0.005 | — |
| 16 | 0.005-0.07 | 0.009-0.89 | — | — | — | — | — | — | 0.005 |
| 17 | 0.005-0.07 | — | 0.009-0.89 | — | — | — | — | — | 0.005 |
| 18 | 0.005-0.07 | 0.009-0.89 | — | — | — | — | — | — | 0.005 |
| 19 | 0.005-0.07 | — | 0.009-0.89 | — | — | — | — | — | 0.005 |

| Alloy/Element | P | S | Fe | B | Zr | Ti | Total |
|---|---|---|---|---|---|---|---|
| 4N soft Cu | each <0.0003 | | each <0.0002 | | | | <100 wt. ppm |
| 1 | — | 0.0003 | — | — | — | — | ≤0.997 |
| 2 | — | — | — | — | — | — | ≤0.997 |
| 3 | — | — | — | — | — | — | ≤0.997 |
| 4 | — | — | — | — | — | — | ≤0.997 |
| 5 | — | — | — | — | — | — | ≤0.997 |
| 6 | — | — | — | — | — | — | ≤0.997 |
| 7 | — | — | — | — | — | — | ≤0.997 |
| 8 | — | — | — | — | — | — | ≤0.997 |
| 9 | — | — | — | — | — | — | ≤0.997 |
| 10 | — | — | — | — | — | — | ≤0.997 |
| 11 | — | — | — | — | — | — | ≤0.997 |
| 12 | 0.008 | — | — | — | — | — | ≤0.997 |
| 13 | 0.008 | — | — | — | — | — | ≤0.997 |
| 14 | — | — | — | — | — | — | ≤0.997 |
| 15 | — | — | — | — | — | — | ≤0.997 |
| 16 | 0.008 | — | — | — | — | — | ≤0.997 |
| 17 | 0.008 | — | — | — | — | — | ≤0.997 |
| 18 | 0.008 | — | 0.005-0.02 | 0.005 | 0.002 | — | ≤0.997 |
| 19 | 0.008 | — | 0.005-0.02 | 0.005 | 0.002 | — | ≤0.997 |

The mechanical and electrical properties of the alloyed wires of the example embodiments are shown in Table 2. Advantageously, the properties are close to the 4N soft Cu reference wire. A representative tensile plot of 2N alloyed Cu wire according to example embodiments is shown in FIG. 1. As can be seen from a comparison of curve 100 (2N alloyed Cu wire according to example embodiments) and curve 102 (the 4N soft Cu reference wire), the deformation behavior is advantageously similar on tensile loading, but may require higher load to plastically deform. The hardness and modulus of 2N alloyed Cu wire according to example embodiments are also slightly higher. The electrical resistivity of the 2N alloyed Cu wire according to example embodiments is advantageously equivalent to that of 4N Au wires, about 2.34 μΩ·cm. This demonstrates that a maximum of about 0.99 wt % alloying advantageously does not drastically alter the deformation characteristics and electrical resistivity of the alloyed wire in example embodiments.

TABLE 2

Corrosion, mechanical and electrical properties of 2N alloyed Cu wires

| Alloy/ Element | Wire Hardness (15 mN/10 s), HV | FAB Hardness (15 mN/10 s), HV | Modulus, GPa | Resistivity, µΩ · cm | Fusing current (for 10 mm length, 300 ms input pulse time), mA | Corrosion resistant (++++ Excellent, +++ very good, ++ Good, + Satisfactory) |
|---|---|---|---|---|---|---|
| 4N soft Cu | ~85 | ~85 | ~90 | ~1.7 | ~340 | |
| 1 | ~90 | ~90 | ~94 | ~2.4 | ~340 | + |
| 2 | ~90 | ~90 | ~94 | ~2.4 | ~340 | + |
| 3 | ~90 | ~90 | ~94 | ~2.4 | ~340 | ++ |
| 4 | ~90 | ~90 | ~94 | ~2.4 | ~340 | ++ |
| 5 | ~90 | ~90 | ~94 | ~2.4 | ~340 | +++ |
| 6 | ~90 | ~90 | ~94 | ~2.4 | ~340 | ++ |
| 7 | ~90 | ~90 | ~94 | ~2.4 | ~340 | ++ |
| 8 | ~90 | ~90 | ~94 | ~2.4 | ~340 | +++ |
| 9 | ~90 | ~90 | ~94 | ~2.4 | ~340 | ++ |
| 10 | ~90 | ~90 | ~94 | ~2.4 | ~340 | +++ |
| 11 | ~90 | ~90 | ~94 | ~2.4 | ~340 | ++ |
| 12 | ~90 | ~90 | ~94 | ~2.4 | ~340 | ++ |
| 13 | ~90 | ~90 | ~94 | ~2.4 | ~340 | +++ |
| 14 | ~90 | ~90 | ~94 | ~2.4 | ~340 | ++ |
| 15 | ~90 | ~90 | ~94 | ~2.4 | ~340 | +++ |
| 16 | ~90 | ~90 | ~94 | ~2.4 | ~340 | + |
| 17 | ~90 | ~90 | ~94 | ~2.4 | ~340 | +++ |
| 18 | ~90 | ~90 | ~94 | ~2.4 | ~340 | + |
| 19 | ~90 | ~90 | ~94 | ~2.4 | ~340 | +++ |

The corrosion resistance of 2N alloyed Cu wires according to example embodiments is significantly better than that of the 4N soft Cu reference wire (Table 2). FIG. 2 shows a representative scan of the 2N alloyed Cu wire according to example embodiments (curve 200), revealing a higher positive rest potential of −139 mV, compared to −255 mV for the 4N soft Cu reference wire (curve 202). As will be appreciated by a person skilled in the art, in a polarization scan, if the rest potential (corrosion potential) of the test element is toward positive, the element is noble. On the other hand, if the rest potential is negative, the element is active (corrosive). Therefore, the 2N alloyed Cu wire according to example embodiments is "nobler" than the 4N soft Cu reference wire. The scan was obtained using dilute HCl electrolyte and stirring the solution maintained at room temperature.

The 2N alloyed Cu wire of example embodiments can be bonded to pads metallized (plated) with Au, Ag, Pd and Cu. On bonding to Al bond pads, the wire bonds are anticipated to have a longer reliability life, especially under HAST and THB tests. FIGS. 3(a), (b) and (c) show representative scanning electron microscope images of loop, ball and stitch bonds of a 2N alloyed 0.8 mil Cu wire according to example embodiments. With reference to FIGS. 4 and 5, it can be seen that the ball and stitch bond process window and reliability performance of the 2N alloyed Cu wire according to example embodiments and of the reference soft Cu 4N wires are nearly the same. More particularly, in FIG. 4(a), the representative ball bond process window 402 for the 2N alloyed Cu wire according to example embodiments is similar to the ball bond process window 400 of the 4N soft Cu reference wire. Similarly, in FIG. 4(b), the representative stitch bond process window 404 for the 2N alloyed Cu wire according to example embodiments is similar to the stitch bond process window 406 for the 4N soft 0.8 mil Cu reference wire. A comparison of curve 500 (FIG. 5(a)) and representative curve 502 (FIG. 5(b)) illustrates that the thermal aging of the 4N soft 0.8 mil Cu reference wire and the 2N alloyed 0.8 mil Cu wire according to example embodiments are also similar.

Ultra low loop bonding of 2N alloyed Cu wires according to example embodiments for 2.4 mil height also revealed good capability similar to the 4N soft Cu reference wire. More particularly, the plot in FIG. 6(a) shows that the representative loop height measured for the bonded 2N alloyed 0.8 mil Cu wire according to example embodiments (labeled 600) is substantially the same as for the 4N soft 0.8 mil Cu reference wire (labeled 602). This indicates that 2N alloyed Cu wires according to example embodiments are soft and perform as well as the 4N soft Cu reference wire. Scanning electron microscope (SEM) images of 2N alloyed 0.8 mil Cu wires (FIGS. 6(b) and (c)) according to example embodiments showed no obvious cracks in the neck region.

Figure 7:
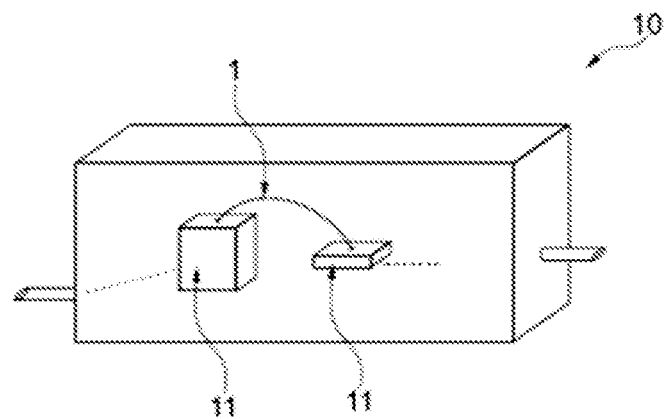
FIG. 7 is a schematic of an electronic device according to an embodiment of the invention.

As an example, FIG. 7 depicts an electronic device 10 comprising two elements 11 and a wire 1. The wire 1 electrically connects the two elements 11, such as bond pads, by a ball bond or wedge bond.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:
1. An alloyed 2N copper wire for bonding in microelectronics, wherein the wire has a diameter of 10 to 250 µm and consists of 2N copper and two corrosion resistance alloying materials selected from the group consisting of Ag, Ni, Pd, Au, Pt, and Cr, and wherein a concentration of the corrosion resistance alloying materials is between about 0.009 wt % and about 0.99 wt %.
2. The alloyed 2N copper wire according to claim 1, wherein the wire consists of about 0.005 wt % to about 0.07 wt % Ag, about 0.009 wt % to about 0.89 wt % Ni, and balance 2N copper.

3. The alloyed 2N copper wire according to claim 1, wherein the wire consists of about 0.005 wt % to about 0.07 wt % Ag, about 0.009 wt % to about 0.89 wt % Pd, and balance 2N copper.

4. The alloyed 2N copper wire according to claim 1, wherein the wire consists of about 0.005 wt % to about 0.07 wt % Ag, about 0.009 wt % to about 0.89 wt % Au, and balance 2N copper.

5. The alloyed 2N copper wire according to claim 1, wherein the wire consists of about 0.005 wt % to about 0.07 wt % Ag, about 0.009 wt % to about 0.89 wt % Pt, and balance 2N copper.

6. The alloyed 2N copper wire according to claim 1, wherein the wire consists of about 0.005 wt % to about 0.07 wt % Ag, about 0.009 wt % to about 0.89 wt % Cr, and balance 2N copper.

7. A system for bonding an electronic device, comprising a first bonding pad, a second bonding pad, and an alloyed 2N copper wire according to claim 1, wherein the wire is connected to the first and the second bonding pads by wedge-bonding.

8. An alloyed 2N copper wire for bonding in microelectronics, wherein the wire has a diameter of 10 to 250 μm and consists of 2N copper and two corrosion resistance alloying materials selected from the group consisting of:
- about 0.005 wt % to about 0.07 wt % Ag and about 0.009 wt % to about 0.89 wt % Ni;
- about 0.005 wt % to about 0.07 wt % Ag and about 0.009 wt % to about 0.89 wt % Pd;
- about 0.005 wt % to about 0.07 wt % Ag and about 0.009 wt % to about 0.89 wt % Au;
- about 0.005 wt % to about 0.07 wt % Ag and about 0.009 wt % to about 0.89 wt % Pt; and
- about 0.005 wt % to about 0.07 wt % Ag and about 0.009 wt % to about 0.89 wt % Cr.

* * * * *